United States Patent [19]
Yamaguchi et al.

[11] Patent Number: 4,914,677
[45] Date of Patent: Apr. 3, 1990

[54] DIGITAL LOCK-IN AMPLIFIER

[75] Inventors: Takahiro Yamaguchi, Kumagaya; Toru Nakanishi; Norio Arakawa, both of Gyoda; Yoshio Takanaga, Ohsato, all of Japan

[73] Assignee: Advantest Corporation, Tokyo, Japan

[21] Appl. No.: 251,795

[22] Filed: Oct. 3, 1988

[30] Foreign Application Priority Data

Oct. 5, 1987 [JP] Japan ................................. 62-251250
Oct. 19, 1987 [JP] Japan ................................. 62-263292

[51] Int. Cl.[4] ............................................. H04L 7/00
[52] U.S. Cl. .......................................... 375/106; 375/4
[58] Field of Search ................... 375/38, 39, 102, 103, 375/106, 111, 97, 4; 370/20; 455/139; 329/124

[56] References Cited

U.S. PATENT DOCUMENTS

4,455,663  6/1984  Ragsdale ............................. 375/103
4,675,880  6/1987  Davarian ............................. 375/39
4,731,801  3/1988  Henriksson ......................... 375/102
4,837,786  6/1989  Gurantz et al. ..................... 370/20

Primary Examiner—Robert L. Griffin
Assistant Examiner—Stephen Chin
Attorney, Agent, or Firm—Staas & Halsey

[57] ABSTRACT

An analog input signal is converted into a digital signal. The digital signal is shifted to the difference frequency region by mixing it with each of a sine wave local signal and a cosine wave local signal to obtain complex waveform data. On the other hand, a trigger signal is generated when a reference signal meets a specific requirement, and a frame composed of a fixed number of data is defined which is synchronized with the trigger signal. The complex waveform data of each frame thus defined is phase rotated so that its phase angle has a predetermined value, or the phases of the local signals are synchronized with the trigger signal so that the complex waveform data of respective frames have the same phase. The in-phase complex waveform data of plural frames thus obtained may also be averaged, if necessary.

23 Claims, 6 Drawing Sheets

DIGITAL LOCK-IN AMPLIFIER

BACKGROUND OF THE INVENTION

The present invention relates to a lock-in amplifier for extracting a very small input signal masked by noise in a signal measuring device.

Figure 1:
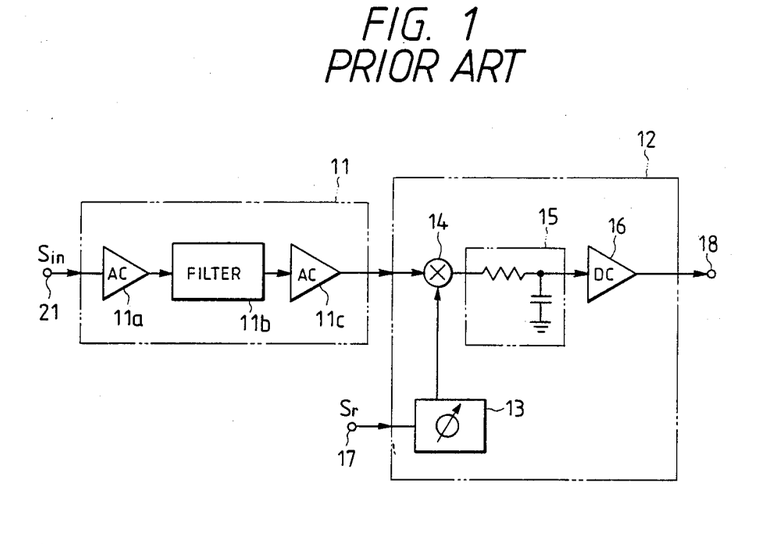
FIG. 1 is a block diagram showing a conventional lock-in amplifier.

The lock-in amplifier functions as a narrow-band filter which extracts a very small signal masked by noise. FIG. 1 shows a conventional analog lock-in amplifier. In FIG. 1 an input signal $S_{in}$ to an input terminal 21 is applied to a phase detector 12 via a narrow-band filter 11 which comprises an AC amplifier 11a, a band-pass filter 11b and an AC amplifier 11c. On the other hand, a reference signal $S_r$ fed to a terminal 17 is provided via a phase shifter 13 to the phase detector 12. In the phase detector 12 the input signal thereto from the narrow-band filter 11 and the reference signal $S_r$ from the phase shifter 13 are mixed by a mixer 14 which forms a synchronous detector, whereby an analog product of the two signals is produced. By this operation the center frequency component of the input signal is frequency shifted to a DC component, producing a synchronous detected output. The synchronous detected output from the mixer 14 is smoothed by an RC integrator 15 to remove noise, and the smoothed output is further amplified by a DC amplifier 16, providing a detected DC output at an output terminal 18.

Now, assuming that the amount of phase shift by the phase shifter 13 is zero and letting the input signal $S_{in}$ to the terminal 21 and the reference signal $S_r$ to the terminal 17 be represented by $S_{in}=A\cos(2\pi f \cdot t + \Omega)$ and $S_r = \cos(a\pi f_c \cdot t + \phi)$, respectively, the synchronous detected output $E_{01}$ available from the mixer 14 can be expressed by the following equation (1):

$$E_{01} = |A\cos(2\pi f \cdot t + \Omega) \times \cos(2\pi f_c \cdot t + \phi)|_{LPF} = A/2 \cos[2\pi(f-f_c)t + \Omega - \phi] \quad (1)$$

where $\Omega$ and $\phi$ are the phases of the input signal $S_{in}$ and the reference signal $S_r$, respectively, and the suffix LPF means that the difference component between frequencies f and $f_c$ is extracted by a low-pass filter. Since the frequency f of the input signal component which is subjected to the synchronous detection is $f=f_c$, Eq. (1) becomes as follows:

$$E_{01} = A/2 \cos(\Omega - \phi) \quad (2)$$

A DC output voltage corresponding to the DC voltage $E_{01}$ is obtained at the terminal 18. Since the phase difference $(\Omega - \phi)$ between the input signal $S_{in}$ and the reference signal $S_r$ is unknown, neither the amplitude A nor the phase $\Omega$ of the input signal can be known from the measured value $E_{01}$ alone. Then, by shifting the phase of the reference signal $S_r$ through 90° with the phase shifter 13 and synchronously detecting the input signal $S_{in}$ in the same manner as described above, a DC voltage $E_{02}$ expressed by the following equation (3) is obtained.

$$E_{02} = A/2 \sin(\Omega - \phi) \quad (3)$$

Calculating the sum of squared values, $W = E_{01}^2 + E_{02}^2$, of the thus measured voltages $E_{01}$ and $E_{02}$, it follows that $$W = E_{01}^2 + E_{02}^2 = A^2/4 \quad (4)$$

From this amplitude A of the input signal $S_{in}$ can be calculated. Further, since the phase difference $(\Omega - \phi)$ can be obtained by calculating the ratio $E_{02}/E_{01} = \tan(\Omega - \phi)$, the phase $\Omega$ could be obtained if the phase $\phi$ of the reference signal $S_r$ is preknown.

In this way, the lock-in amplifier is capable of detecting from the input signal $S_{in}$ the amplitude of a signal component which is equal in frequency to the reference signal $S_r$ of the frequency $f_c$ and bears a fixed phase relationship thereto, that is, the amplitude of a signal component which is coherent with the phase of the reference signal $S_r$. However, the lock-in amplifier cannot extract an AC waveform of the input signal $S_{in}$ nor can it extract a wide-band input signal naturally. The SN ratio of the detected DC level could be improved simply by selecting the time constant of the RC integrator 15 large, but this would inevitably increase the time for measurement. Further, such an integrating type filter cannot be employed in the extraction of the AC waveform, because it would distort the waveform.

Recently there has been placed on the market a lock-in amplifier of the type that obtains the amplitude and phase information of an input signal by a single measurement through use of two phase detectors supplied with sine and cosine waves as reference signals, respectively, instead of providing 0° and 90° phase shifts of the reference signal $S_r$ by the phase shifter 13 and carrying out the measurement twice as described above with regard to FIG. 1; and this lock-in amplifier is entirely made up of digital circuits. But the principle of measurement adopted in this instance is exactly the same as referred to above in connection with FIG. 1. Accordingly, this lock-in amplifier still offers no solutions to the above-mentioned problems.

SUMMARY OF THE INVENTION

It is an object of the present invention to provide a digital lock-in amplifier which permits the extraction of a coherent input signal waveform.

Another object of the present invention is to provide a digital lock-in amplifier which permits the extraction of a wide-band input signal waveform.

Yet another object of the present invention is to provide a digital lock-in amplifier which improves the SN ratio of a coherent AC input signal.

To attain the above objective, the digital lock-in amplifier includes: A/D converting means for converting an analog input signal to digital form; frequency converting means which shifts the digital signal to a difference frequency region by mixing it with each of a sine wave local signal and a cosine wave local signal and provides the mixed outputs as complex waveform data; trigger signal generating means for generating a trigger signal when a reference signal meets a specified requirement; and frame defining means responsive to the trigger signal to define a frame composed of a predetermined number of data. The digital lock-in amplifier further includes phase adjusting means whereby the phase of the complex waveform data of the frame defined in synchronism with the trigger signal is rotated so that the initial phase angle of the complex waveform data assumes a predetermined value, or the phase of a local signal is synchronized with the phase of the trigger signal to make the complex waveform data of respective frames in-phase. The digital lock-in amplifier may preferably be further provided with means for averaging the in-phase complex waveform data of the plurality of frames.

DESCRIPTION OF THE PREFERRED EMBODIMENTS

Figure 2:
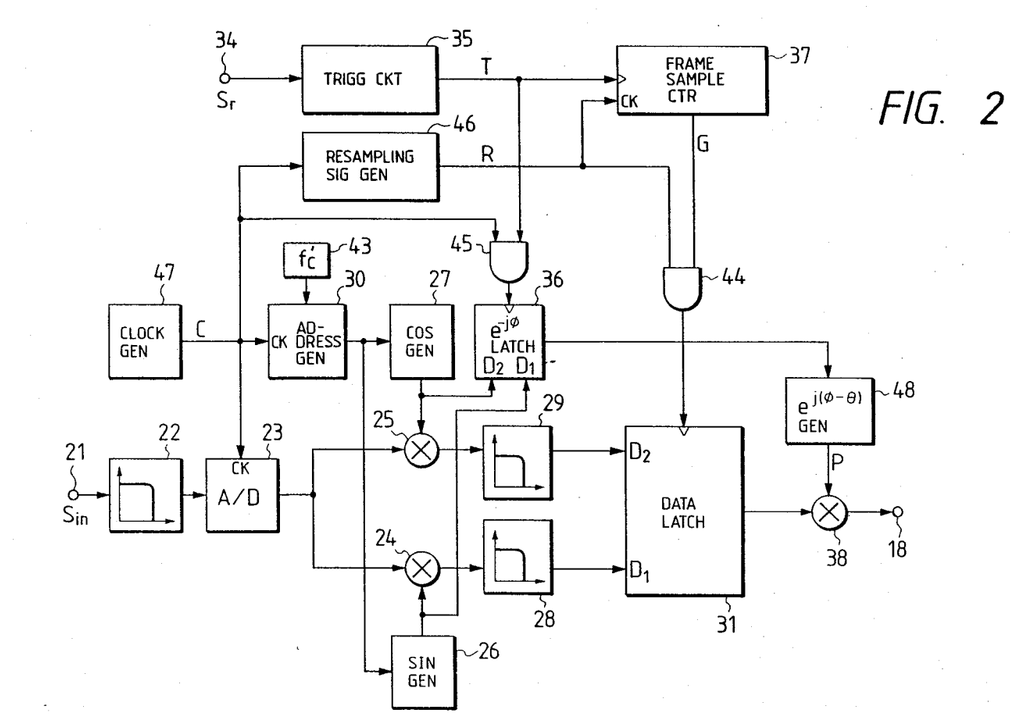
FIG. 2 is a block diagram illustrating an embodiment of the digital lock-in amplifier of the present invention.

FIG. 2 illustrates in block form an embodiment of the present invention, which has an arrangement in which, upon each occurrence of a trigger signal T, waveform data for one frame of the input signal $S_{in}$ is always provided in the same phase relative to the trigger signal T. The analog input signal $S_{in}$ fed to the input terminal 21 is applied to a filter 22, wherein an unnecessary high-frequency component is removed, and the input signal $S_{in}$ is then provided to an A/D converter 23, wherein it is converted to a digital signal at each clock C of a fixed period $\Delta t$ which is supplied from a clock generator 47. The digital signal is applied to first and second digital frequency converters 24 and 25, wherein it is mixed with a sine wave local signal from a sine wave generator 26 and a cosine wave local signal from a cosine wave generator 27. The sine wave generator 26 and the cosine wave generator 27 are formed by memories which have stored therein sample values of a sine waveform and a cosine waveform, respectively, and from which the waveform sample values are read out using addresses which are sequentially created by an address generator 30. The address generator 30 is formed by a cumulative adder, for instance, which, upon each application of the clock C from the clock generator 47, cumulatively adds a value $f'_c$ set in a register 43 and yields the added results as the addresses. The address generator 30 will overflow when the added value exceeds a predetermined value. The value $f'_c$ set in the register 43 is a value which corresponds to the frequency $f_c$ of the sine and cosine waves to be generated and sets the interval between the successive addresses for reading out the waveforms from the sine and cosine wave generators 26 and 27.

The outputs of the first and second digital frequency converters 24 and 25 are applied to first and second digital filters 28 and 29, respectively, in which their high-frequency bands are removed and from which are output sine and cosine wave components of difference frequencies between the input signal $S_{in}$ and the sine and cosine wave local signals. The sine wave component and the cosine wave component can be considered as an imaginary part and a real part of a signal expressed by a complex number. By this operation, the input signal $S_{in}$ is shifted to a lower frequency region and provided as complex waveform data. On the other hand, the reference signal $S_r$, which has a correlation with the input signal $S_{in}$, is applied via a terminal 34 to a trigger circuit 35. The reference signal $S_r$ needs only to have a certain correlation with the input signal $S_{in}$, and the latter may also be applied as the reference signal $S_r$ to the terminal 34. The trigger circuit 35 yields the trigger signal T each time predetermined one or more of the amplitude, the envelope gradient, the phase, etc. of the reference signal $S_r$ meet predetermined requirements. Consequently, the timing of generation of the trigger signal T bears a fixed phase relation to the input signal $S_{in}$.

The trigger signal T is provided via a gate 45 to a trigger terminal of a phase latch 36. The phase latch 36 responds to the trigger signal T to latch sample values of the sine and cosine waves being generated by the sine and cosine wave generators 26 and 27, as information indicating their phase at that time. In this embodiment the phase is regarded as the initial phase $\phi$ of each of the sine and cosine wave local signals, and two values of $\sin\phi$ and $\cos\phi$ are latched in the latch 36, as information data indicating the phase $\phi$. In FIG. 2 the phase $\phi$ is expressed as a complex number $e^{-j\phi}$. The trigger signal T is provided also to a frame sample counter 37, causing it to generate a gate signal G whose duration is equal to one frame period of the input signal. The frame sample counter 37 is normally outputting a low logical level but, when supplied with the trigger signal T, inverts the output to a high logical level and at the same time counts, by the number of data of one frame, resampling signals R which are obtained through frequency division of the clock C by a resampling signal generator 46. Upon completion of the counting operation the counter 37 returns its output to the initial low logical level. In this way, the frame sample counter 37 yields the gate signal G of one frame period. The gate signal G is applied to one terminal of an AND gate 44 and the resampling signals R which are applied to the other terminal of the AND gate 44 in the duration of the gate signal G are provided therethrough to a trigger terminal of a data latch 31. The data latch 31 is being supplied at its data input terminals $D_1$ and $D_2$ with waveform data of the sine and cosine wave components from the first and second digital filters 28 and 29 upon each occurrence of the clock C. The data latch 31 latches and outputs only those of such sequences of waveform data which coincide with the resampling signals R in timing. The output waveform data from the data latch 31 is provided to a multiplier 38, wherein it is multiplied by a phase signal $e^{j(\phi-\theta)}$, whereby the phase angle of the complex waveform data is rotated by $(\phi-\theta)$ in a reverse direction with respect to the phase $e^{-j\phi}$. As a result of this, the complex waveform data of each frame is derived at the terminal 18 as waveform data of a fixed phase $\theta$ unrelated to the phase $\phi$ of the local signals. A phase signal generator 48 calculates $e^{j(\phi-\theta)}$ on the basis of the phase information $e^{-j\phi}$ from the phase latch 36 and the predetermined phase $\theta$ and provides the calculated value as a phase signal P to the multiplier 38.

Now, letting waveform sample data obtained by converting the input signal $S_{in}$ of the cosine wave to digital form represented by $A\cos(2\pi f \cdot n \cdot \Delta t + \Omega)$ and expressing this in the form of a complex exponential function, it becomes as follows:

$$S_{in} = A\cos(2\pi f \cdot n \cdot \Delta t + \Omega) = A/2[\exp\{j(2\pi f \cdot n \cdot \Delta t + \Omega)\} + \exp\{-j(2\pi f \cdot n \cdot \Delta t + \Omega)\}] \qquad (5)$$

where A, f and $\Omega$ are the amplitude, the frequency and the initial phase of the input signal $S_{in}$, $\Delta t$ the sampling period, and n sampling numbers which are consecutive integers such as ... −3, −2, 0, 1, 2, .... Letting waveform sample data of the sine and cosine wave local signals available from the sine and cosine wave generators 26 and 27 be represented by $\sin(2\pi f_c \cdot n \cdot \Delta t + \phi)$ and $\cos(2\pi f_c \cdot n \cdot \Delta t + \phi)$, respectively, these local signals can be expressed, as follows, by a complex number using the former as the imaginary part and the latter as the real part:

$$\cos(2\pi f_c \cdot n \cdot \Delta t + \phi) - j\sin(2\pi f_c \cdot n \cdot \Delta t + \phi) = \exp\{-j(2\pi f_c \cdot n \cdot \Delta t + \phi)\} \quad (6)$$

where $f_c$ and $\phi$ are the frequency and the initial phase of the local signals. Accordingly, by subjecting the input cosine wave signal to orthogonal modulation by the complex-represented local signals in the digital frequency converters 24 and 25 and applying the orthogonal-modulated signals to the digital low-pass filters 28 and 29, a waveform signal of the following complex representation is obtained.

$$\frac{A}{2} |[\exp\{j(2\pi f \cdot n \cdot \Delta t + \Omega)\} + \exp\{-j(2\pi f \cdot n \cdot \Delta t + \Omega)\}] \times \exp\{-j(2\pi f_c \cdot n \cdot \Delta t + \phi)\}|_{LPF} = \frac{A}{2} \exp\{j[2\pi(f - f_c) \cdot n \cdot \Delta t + \Omega]\} \times \exp{-j\phi} \quad (7)$$

The right side of Eq. (7) can be further rewritten as follows:

$$= A/2 \{\cos[2\pi(f - f_c) \cdot n \cdot \Delta t + \Omega - \phi] + j\sin[2\pi(f - f_c) \cdot n \cdot \Delta t + \Omega - \phi]\} \quad (7')$$

The sine wave component, which is the imaginary part of Eq. (7'), is provided from the digital filter 28 and the cosine wave component, which is the real part of Eq. (7'), is provided from the digital filter 29. As is evident from Eq. (7) or (7'), the output waveforms from the digital filters 28 and 29 are each a converted version of the input signal $S_{in}$ to a frequency of the difference between it and each of the local signals and, at the same time, they have been phase rotated by the phase $\phi$ of the local signals on the complex plane coordinate axes. The phase $\phi$ has no correlation to the input signal $S_{in}$ and represents the phase of each local signal which happens to occur at the start of the frame of the input signal $S_{in}$, and the phases $\phi_1, \phi_2, \phi_3, \ldots$ of the frames which are triggered by respective trigger signals T take random values unrelated to one another. Consequently, the complex waveforms of a sequence of frames which are provided from the data latch 31 have no correlation to one another; namely, they are incoherent.

In this embodiment the complex waveform data of each frame output from the data latch 31, given by Eq. (7), is multiplied by the phase signal P (expressed by $e^{j(\phi - \theta)}$) in the multiplier 38, thereby cancelling the random phase $\phi$ and rotating the phase of the complex waveform data through a preknown fixed angle $\theta$. In this instance, the angle $\theta$ may be set to zero, for example. Consequently, the multiplier 38 provides at its output in-phase or coherent complex waveform data of a sequence of frames in response to the generation of a series of trigger signals T.

In FIG. 2 the frequency $1/\Delta t$ of the clock C, which is created by the clock generator 47, is selected relatively high so that an arbitrary input signal can also be sampled over a wide frequency range of measurement.

With the device of the present invention, however, since the input signal $S_{in}$ is shifted to the difference frequency between it and each of the local signals, the frequency region of measurement becomes low and the sampling period for signal waveforms in the converted frequency region can be lengthened accordingly. The resampling generator 46 can generate the resampling signal R of a desired period longer than that $\Delta t$ of the clock C from the clock generator 47 by frequency dividing the clock C at will as referred to previously. Assuming that a maximum count value of the frame sample counter 37 is constant which sets the number of data of one frame output from the data latch 31, the time length of one frame can be altered by changing the period of the resampling signal R. Accordingly, for example, in the case where an FFT device is connected to the output terminal 18 in the embodiment of FIG. 2 to form a digital spectrum analyzer as a whole for a frequency analysis of the input signal $S_{in}$, the frequency resolution of the spectrum analyzer can be raised m-fold (where m is an arbitrary positive integer) by making the period of the resampling signal R m-fold. In other words, the resampling signal generator 46 is capable of setting the scale factor of the frequency scale of the frequency region for measurement. Thus, the data latch 31 performs the function of a resampling switch as well.

Figure 3:
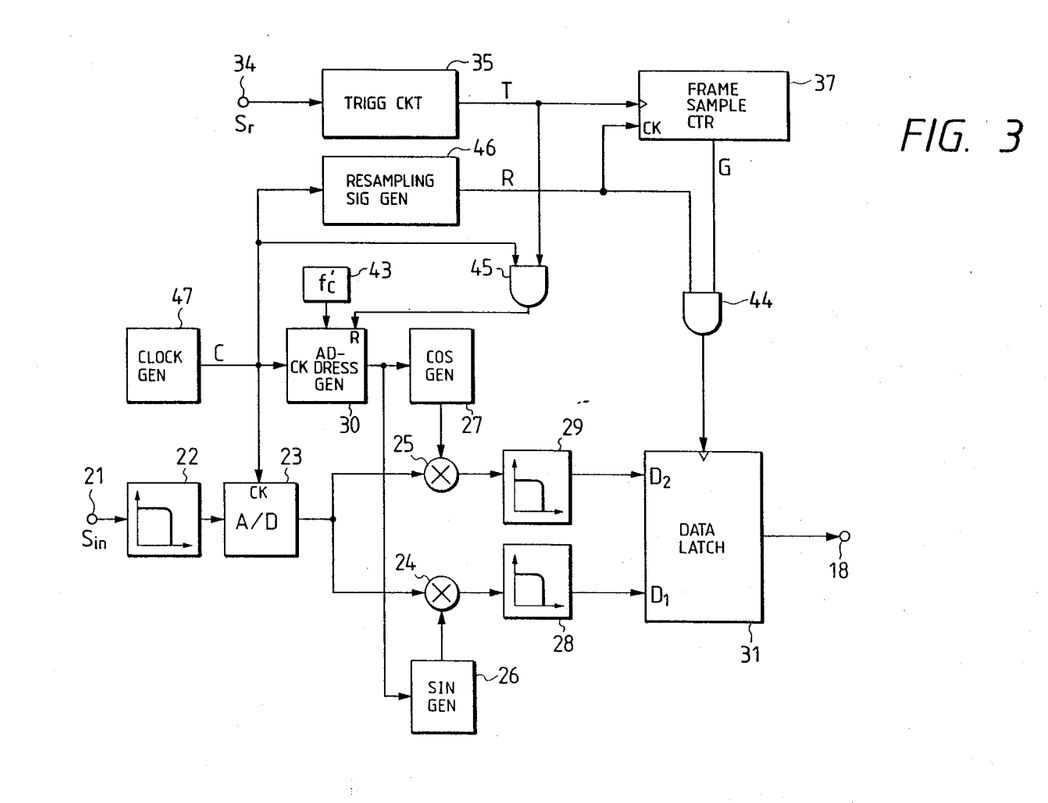
FIG. 3 is a block diagram illustrating another embodiment of the digital lock-in amplifier of the present invention.

FIG. 3 illustrates another embodiment of the present invention, which is identical with the embodiment of FIG. 2 in the arrangement in which the input signal $S_{in}$ is converted to a digital signal, shifted to a lower frequency region and output as complex waveform data from the first and second digital filters 28 and 29. However, this embodiment is not provided with any of the phase latch 36, the phase signal generator 48 and the multiplier 38 used in the embodiment of FIG. 2, but instead this embodiment is arranged so that the address generator 30 is reset by the trigger signal T from the gate 45 which is synchronized with the clock C. With this arrangement, the address generator 30 is surely reset to zero at the time point when the frame is started by each trigger signal T, after which the address is incremented by the value $f'_c$ upon each occurrence of the clock C. Accordingly, phase adjustment is made so that the initial phase $\phi$ of the sine and cosine wave local signals, which are provided from the sine and cosine wave generators 26 and 27 upon each occurrence of the trigger signal T, is certainly set to a predetermined value. As a result of this, the phase $\phi$ in Eq. (7) or (7') becomes constant and preknown, so that coherent input signal waveform data of the same phase $(\Omega - \phi)$ is obtained at the output terminal 18 for each frame.

Figure 4:
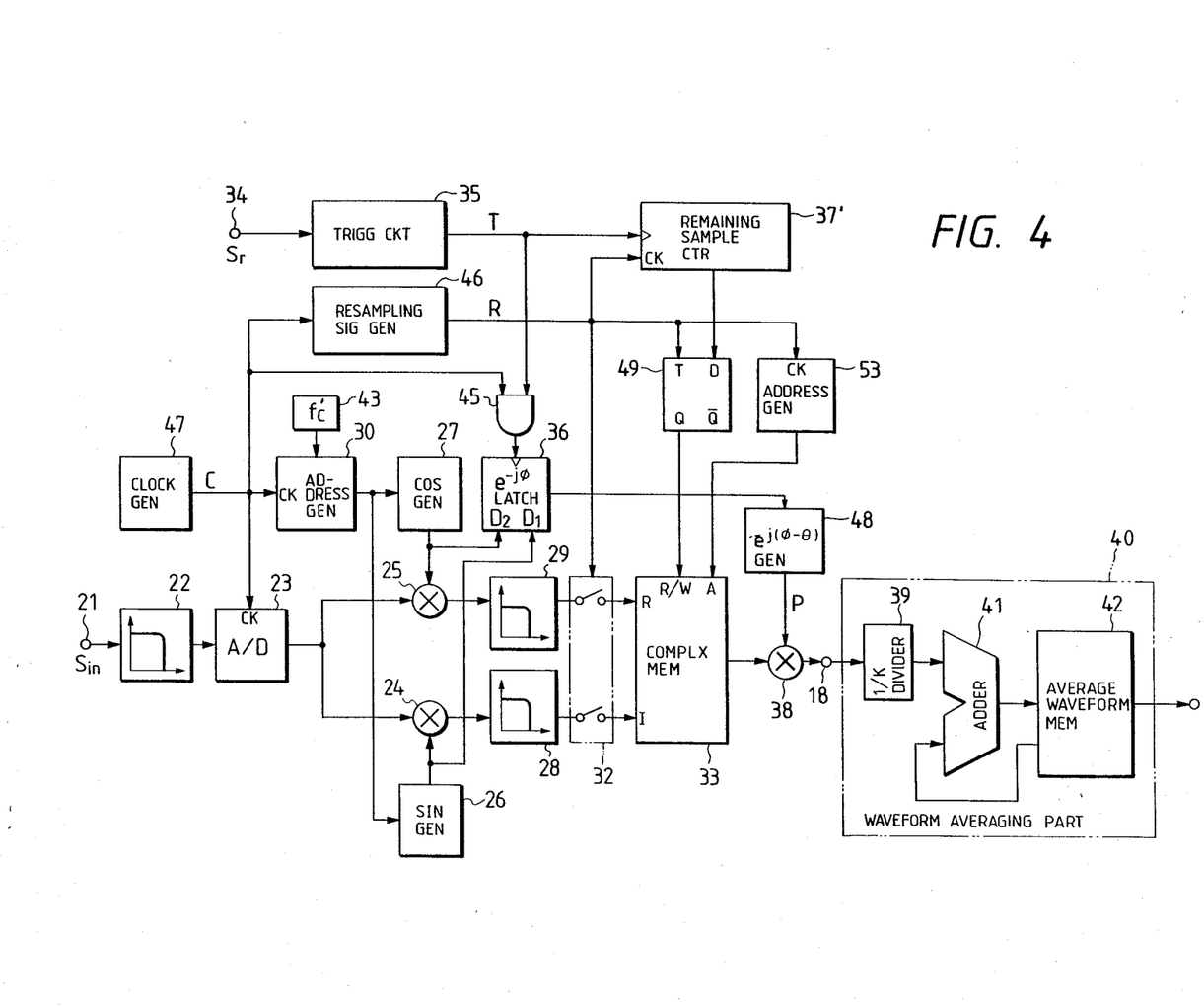
FIG. 4 is a block diagram illustrating another embodiment of the digital lock-in amplifier of the present invention.

While in the above the embodiments of FIGS. 2 and 3 have been described, so as to facilitate a better understanding of the principle of the present invention, to employ the arrangement in which one frame composed of N successive waveform data starts at the time point of the generation of the trigger signal T, it is often necessary, for analyzing the casual relationship between a phenomenon in actual signal measurement, to extract one frame composed of N successive data extending across the trigger signal T. FIG. 4 illustrates an embodiment which is arranged so that N successive waveform data can be extracted extending across the trigger signal T in the lock-in amplifier which utilizes the phase adjustment method involving the multiplication by the phase signal $e^{j(\phi - \theta)}$ as described previously with respect to FIG. 2. In addition, this embodiment is provided with waveform averaging section 40 in which coherent complex waveform data of plural frames available at the output terminal 18 is averaged to provide for improved SN ratio.

As is the case with the embodiment of FIG. 2, the input signal $S_{in}$ converted to digital form is frequency converted by the first and second frequency converters 24 and 25, after which difference frequency components between the A/D-converted output and the local signals are detected by the digital filters 28 and 29. The output waveform data from the filters 28 and 29 are sequentially written via a resampling switch 32 into a complex memory 33 as the imaginary part and the real part of a signal expressed by a complex number, respectively. The complex memory 33 has storage area of at least one frame, that is, storage areas which correspond to N consecutive address created by the address generator 53. In order to repeatedly access the N storage areas at all times, an address generator 53 is provided which always counts the resampling signals R and repeatedly generates addresses 0 to N−1 in a sequential order. A remaining sample counter 37', connected to the outputs of the trigger circuit 35 and the resampling signal generator 46, is normally outputting a logical level "1", but when supplied with the trigger signal T, the counter 37' immediately starts counting a predetermined number M of resampling signals R and, upon completion of the counting, it inverts its output level to "0". In this case, the value of M is selected to be equal to or smaller than the number N of waveform data of one frame. While the output of the remaining sample counter 37' is at the "1" level, the Q output of a flip-flop 49 is held at the "1" level, controlling the complex memory 33 to stay in the write mode. Accordingly, the contents of the N storage areas of the complex memory 33 are repeatedly updated in succession by a sequence of complex waveform data resampled during the write mode. When the output of the residual sample counter 37' goes down to the "0" level upon completion of counting M resampling signals R, the Q output of the flip-flop 49 also goes down to the "0" level, switching the complex memory 33 to the read mode. At the time point when the Q output of the flip-flop 49 goes to the "0" level, N contiguous waveform data including waveform data at the time of generation of the trigger signal T being written into the N storage areas of the complex memory 33. An address, which is generated by the address generator 53 immediately before the Q output of the flip-flop 49 goes to the "0" level, is provided to the complex memory 33, writing last data of one frame into the corresponding storage area. Then, when the Q output of the flip-flop 49 goes to the "0" level, the complex memory 33 enters the read mode starting at the address next to the address where the latest data was written. Since there is stored the oldest data, i.e. the waveform data heading the frame, at the address at which the readout starts, the read mode will always start at the beginning of the frame automatically. The complex waveform data of each frame thus read out of the complex memory 33 is subjected to the phase rotation by the multiplier 38, thereafter being provided at the output terminal 18. As will be apparent from the above, the waveform data of one frame written in the complex memory 33 in response to the occurrence of each trigger signal T is read out automatically starting at the beginning of the frame regardless of the address at which it has been stored, and consequently complex waveform data of the same phase is obtained at the output terminal 18.

In the embodiment of FIG. 4 the waveform averaging section 40 is connected to the terminal 18. The waveform averaging section 40 is to average complex waveform data of K frame which are supplied thereto from the terminal 18. The waveform averaging section 40 includes a divider 39 for dividing the input data by K, an average data memory 42, and an adder 41 for adding together the divided output of the divider 39 and data read out of the average data memory 42, the added output being re-written into the average data memory 42 at the address from which the above-said data was read out. In the initial state, since the average data memory 42 is held all zeros, N successive waveform data of a first phase-rotated frame supplied from the terminal 18 are each only divided by K and sequentially written into the average data memory 42 at addresses 0 to N−1. Then, the readout of the waveform data of the second frame from the complex memory 33 is started and the first data of the second frame is subjected to the $(\phi-\theta)$ phase rotation and the division by K and applied to one output of the adder 41, while at the same time the data stored in the average data memory 42 at the address 0 is read out and provided to the other input of the adder 41, wherein it is added to the above-mentioned data. The added output of the adder 41 is written into the average data memory 42 at the address 0 again. Next, second data of the second frame read out of the complex memory 33 is similarly subjected to the $(\phi-\theta)$ phase rotation, divided by K and added with data read out of the average memory 42 at the address 1, and the added output of the adder 41 is written into the average data memory 42 at the address 1 again. In this way, the N successive data of one frame which are read out of the complex memory 33 are each subjected to the $(\phi-\theta)$ phase rotation, the division by K and the addition with data read out of the average data memory 42 at the corresponding address, and the added output is written into the memory 42 at the said corresponding address. By repeating this operation for the K frames, their data contents are averaged. This averaging operation reduces noise and improves the SN ratio. The reason for which noise can be reduced by averaging waveform data of plural frames as mentioned above is that the complex waveforms of the frames derived at the output terminal 18 are of the same phase. Incidentally, the waveform averaging section 40, the complex memory 33, the phase signal generator 48 and the multiplier 38 may also be formed by a microcomputer including a CPU and two RAMs.

Figure 5:
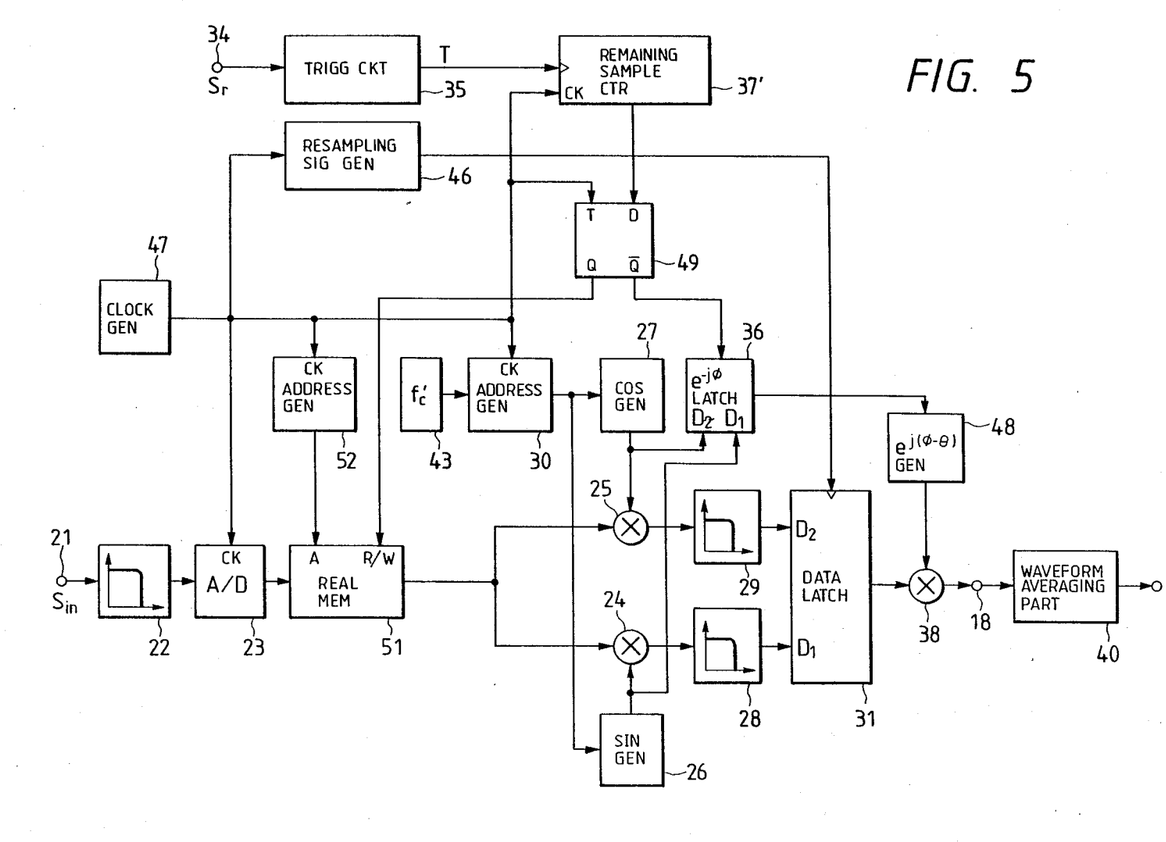
FIG. 5 is a block diagram illustrating another embodiment of the digital lock-in amplifier of the present invention.

FIG. 5 illustrates in block form another embodiment of the present invention, which is identical with the embodiment of FIG. 2 in that the complex waveform data available from the outputs of the first and second digital filters 28 and 29 is multiplied by the phase signal $e^{j(\phi-\theta)}$ to thereby make the phase adjustment. This embodiment differs from the embodiment of FIG. 2 in an arrangement in which the output signal of the A/D converter 23 is not directly subjected to the digital frequency conversion but is first stored in a real memory 51 and the digital signal read out therefrom is subjected to the frequency conversion. In addition the phase information $2^{-j\phi}$ of the local signals is not loaded into the phase latch 36 immediately after the generation of the trigger signal T, but instead a predetermined number of output digital signals of the A/D converter 23 are written into the real memory 51. At the time point of starting the readout of the memory 51 after completion of the write thereinto, the phase information $e^{-j\phi}$ of the local signals is placed into the phase latch 31. That is to say, in this embodiment the trigger signal T indirectly controls the time point of loading the phase information $e^{-j\phi}$ into the phase latch 36.

This embodiment will be described in more detail. As in the embodiment of FIG. 2, the input signal $S_{in}$ is provided via the filter 22 to the A/D converter 23, wherein it is converted to digital form through sampling upon each occurrence of the clock C. In order to repeatedly access storage areas of the real memory 51 for one frame composed of L successive data, an address generator 52 counts the clocks C and repeatedly generates addresses 0 to L−1 in succession, L being an integer equal to or greater than N. As in the embodiment of FIG. 4, the remaining sample counter 37' is normally outputting the logical level "1" to the data terminal D of the flip-flop 49 but, when supplied with the trigger signal T from the trigger circuit 35, the counter 37' immediately start counting a predetermined arbitrary number M' (where $0 \leq M' \leq L$) of clocks C and, upon completion of the counting, makes its output the logical level "0". Accordingly, the flip-flop 49 always has its Q output at the "1" level until then and controls the real memory 51 to stay in the write mode, but the flip-flop 49 is triggered by the clock C which occurs immediately after the counting of the predetermined number M' of clocks C by the residual sample counter 37' after the generation of the trigger signal T and the Q output of the flip-flop 49 goes to the "0" level, switching the real memory 51 to the read mode. At the point of time when the Q output of the flip-flop 49 goes to the "0" level, L contiguous waveform data including data at the time point of generation of the trigger signal T is being written into the real memory 51 at the L addresses and the read mode is executed starting with the oldest one of the L pieces of data, i.e. the waveform data at the beginning of the frame. Upon switching the real memory 51 to the read mode, the $\overline{Q}$ output of the flip-flop 49 goes to a "1", by which the phase latch 36 is triggered and the sample value of each of the sine wave local signal and the cosine wave local signal is placed as the phase information $e^{-j\phi}$ into the phase latch 36. At the same time, the waveform data read out of the real memory 51 is supplied to the first and second digital frequency converters 24 and 25. Thereafter the frequency-converted complex waveform data is resampled by the data latch 31 and adjusted in phase by the multiplier 35 starting with the data heading the frame and then provided to the output terminal 18 as described previously in connection with the embodiment of FIG. 2.

In the embodiment of FIG. 5, since the time from the generation of the trigger signal T to the writing of the last waveform data of one frame is always $\Delta t \times M'$ (where $\Delta t$ is the period of the clock C), the temporal position of the trigger signal T relative to the L successive waveform data of one frame which is written by the trigger signal T is always fixed. Moreover, the phase information $e^{-j\phi}$ of the local signals is latched in the phase latch 36 at the time of starting the readout of the real memory 51, that is, at the beginning of the waveform data frame. Thereafter, the temporal relationship between the generation of the trigger signal T and the latching of the phase information $e^{-j\phi}$ is fixed on each frame. Accordingly, as in the embodiment of FIG. 2, by performing the phase adjustment for cancelling the random phase $\phi$ for each frame, it is possible to obtain complex waveform data of the same phase for all frames. Besides, the SN ratio can be improved by averaging, in the waveform averaging section 40, the complex waveform data of plural frames thus obtained, as described previously with respect to FIG. 4.

Figure 6:
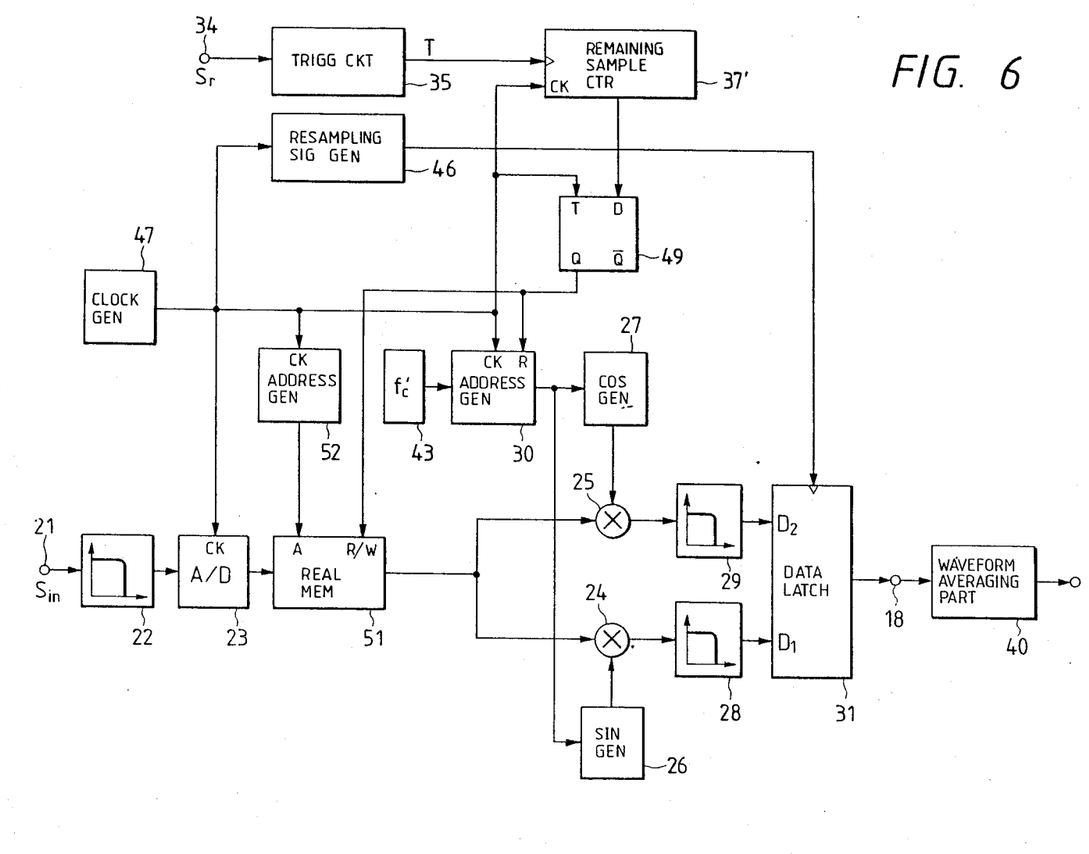
FIG. 6 is a block diagram illustrating still another embodiment of the digital lock-in amplifier of the present invention.

FIG. 6 illustrates in block form still another embodiment of the present invention, in which the input signal waveform converted to digital form is written into the real memory 51 prior to the frequency conversion, as in the embodiment of FIG. 5. This write mode is stopped when the residual sample counter 37' has counted the predetermined number M' of clocks C after the generation of the trigger signal T, and the write mode is immediately switched to the read mode. Consequently, also in this case, the readout of each frame certainly starts with the waveform data at the beginning thereof. In this embodiment, at the same time as the Q output of the flip-flop 49 goes down to the "0" level and the readout begins, the address generator 30 is released from the reset state, starting the address generation with "0" at all times. In consequence, the phase $\phi$ of the local signals always assumes the same value at the time when the waveform data at the beginning of each frame is read out of the real memory 51. Also in this embodiment, the waveform averaging section 40 may be connected to the terminal 18 for enhancing the SN ratio.

While in the embodiments of FIGS. 5 and 6 the residual sample counter 37' is arranged to count the clock C, it may also be arranged to count the resampling signal R as shown in FIG. 4. Conversely, the residual sample counter 37' in FIG. 4 may also be adapted to count the clock C.

It is also possible to provide a predetermined number of frame storage areas in each of the complex memory 33 in FIG. 4 and the real memory 51 in FIGS. 5 and 6 and to read out therefrom waveform data after writing the data into all the frame storage areas. In such an instance, means is provided for latching a write end address for each frame storage area and provision is made for starting the readout of each frame storage area at the address next to the latched corresponding write end address.

It will be apparent that many modifications and variations may be effected without departing from the scope of the novel concepts of the present invention.

What is claimed is:

1. A digital lock-in amplifier, coupled to receive a reference signal, an analog input signal and a clock of a fixed period, comprising:
   an A/D converter which receives the analog input signal and converts it, in synchronism with the clock of a fixed period, into a digital signal expressed by a sequence of digital waveform data;
   local signal generating means for generating a digital sine wave local signal and a digital cosine wave local signal;
   frequency converting means for shifting the digital signal from said A/D converter to the difference frequency region by mixing it with each of the sine wave local signal and the cosine wave signal, and for outputting the frequency-converted digital signals as complex waveform data;
   trigger signal generating means for receiving the reference signal and generating a trigger signal when a predetermined requirement of the reference signal is met;
   frame defining means, responsive to the trigger signal, for defining a frame composed of a sequence of N successive complex waveform data in a fixed positional relation to the trigger signal, where N is a positive integer;

phase latch means, responsive to the trigger signal, for latching and holding sample values of the sine wave local signal and the cosine wave local signal, as their phase information, in a fixed positional relation to the trigger signal; and phase rotating means for rotating the phase angle of the complex waveform data of the defined frame to a fixed phase angle on the basis of the phase information latched in said phase latch means.

2. The digital lock-in amplifier of claim 1, further comprising complex memory means capable of storing at least N successive complex waveform data from the frequency converting means, wherein said phase rotating means phase-rotates the complex waveform data read out of said complex memory means.

3. The digital lock-in amplifier of claim 2, wherein said frame defining means includes remaining sample counting means for defining the end of the frame by the Mth complex waveform data after receiving the trigger signal, M being an integer equal to or smaller than N.

4. The digital lock-in amplifier of claim 3, further comprising:

resampling signal generating means for extracting the clock at regular intervals and outputting the clock as a resampling signal;

resampling means for extracting complex waveform data from the sequence of complex waveform data from said frequency converting means for each resampling signal and providing the extracted complex waveform data to said complex memory means; and control means for controlling the read and write of said complex memory means, wherein said remaining sample counting means generates a frame end signal indicating the end of the frame by counting M resampling signals after receiving the trigger signal and said control means responds to the frame end signal to switch said complex memory means to a read mode.

5. The digital lock-in amplifier of claim 4, wherein said control means includes address generating means for counting the resampling signals and for repeatedly generating a sequence of N addresses for application to said complex memory means.

6. The digital lock-in amplifier of any one of claims 1, 2, 3, 4 and 5, further comprising waveform averaging means connected to the output of said phase rotating means, for averaging the phase-rotated complex waveform data of a predetermined number of frames.

7. A digital lock-in amplifier coupled to receive an analog input signal, a clock of a fixed period, and a reference signal, comprising:

an A/D converter which receives the analog input signal and converts it, in synchronism with the clock of a fixed period, into a digital signal expressed by a sequence of digital waveform data;

real memory means which has at least L storage areas for storing the sequence of digital waveform data from said A/D converting means, L being a positive integer;

local signal generating means for generating a digital sine wave local signal and a digital cosine wave local signal;

frequency converting means for receiving the digital signal read out of said real memory means, for shifting the digital signal to the difference frequency region by mixing it with each of the sine wave local signal and the cosine wave local signal and for outputting the frequency-converted digital signals as complex waveform data;

trigger signal generating means for receiving the reference signal and generating a trigger signal when a predetermined requirement of the reference signal is met;

frame defining means, responsive to the trigger signal, for defining a frame composed of a sequence of L successive digital waveform data in a fixed positional relation to the trigger signal;

phase latch means responsive to the trigger signal, for latching and holding sample values of the sine wave local signal and the cosine wave local signal, as their phase information, in a fixed positional relation to the trigger signal; and phase rotating means for rotating the phase angle of the complex waveform data of the defined frame to a fixed phase angle on the basis of the phase information latched in said phase latch means.

8. The digital lock-in amplifier of claim 7, wherein said frame defining means includes remaining sample counting means for defining the end of the frame by the Mth digital waveform data after receiving the trigger signal, M being an integer equal to or greater than L.

9. The digital lock-in amplifier of claim 8, further comprising:

resampling signal generating means for extracting the clock at regular intervals and outputting the clock as a resampling signal;

resampling means for extracting complex waveform data from the sequence of complex waveform data from said frequency converting means for each resampling signal and for providing the extracted complex waveform data to said phase rotating means; and control means for controlling the read and write of said real memory means, wherein said remaining sample counting means generates a frame end signal immediately after the Mth digital waveform data and said control means responds to the frame end signal to switch said real memory means to a read mode.

10. The digital lock-in amplifier of claim 9, further comprising address generating means for counting the resampling signals and repeatedly generating a sequence of L addresses for application to said real memory means.

11. The digital lock-in amplifier of any one of claims 7, 8, 9 and 10, further comprising waveform averaging means, connected to the output of said phase rotating means, for averaging the phase-rotated complex waveform data of a predetermined number of frames.

12. A digital lock-in amplifier coupled to receive an analog input signal, a clock of a fixed period, and a reference signal, comprising:

A/D converting means for receiving the analog input signal and converting it, in synchronism with the clock of a fixed period, into a digital signal expressed by a sequence of digital waveform data;

local signal generating means for generating a digital sine wave local signal and a digital cosine wave local signal;

frequency converting means for shifting the digital signal from said A/D converting means to the difference frequency region by mixing it with each of the sine wave local signal and the cosine wave local signal, and for outputting the frequency-converted digital signals as complex waveform data;

trigger signal generating means for receiving the reference signal and generating a trigger signal when a predetermined requirement of the reference signal is met;

frame defining means, responsive to the trigger signal, for defining a frame composed of a sequence of N pieces of complex waveform data in a fixed positional relation to the trigger signal, N being a positive integer;

phase synchronizing means, responsive to the trigger signal, for synchronizing the sine wave local signal and the cosine wave local signal with the trigger signal.

13. The digital lock-in amplifier of claim 12, wherein said local signal generating means includes:

first and second memories having stored therein digital sample values of the sine wave local signal and the cosine wave local signal, respectively; and address generating means for accumulating a predetermined value for each clock, for repeating the accumulation until the accumulated value exceeds a predetermined value and, for each accumulation, providing the accumulated value as an address to each of said first and second memories, wherein said phase synchronizing means resets the address generated by said address generating means to a fixed initial value.

14. The digital lock-in amplifier of claim 12, wherein said frame defining means includes frame sample counting means for defining the end of the frame by the Nth complex waveform data after receiving the trigger signal.

15. The digital lock-in amplifier of claim 14, further comprising:

resampling signal generating means for extracting the clock at regular intervals and outputting it as a resampling signal; and resampling means for extracting complex waveform data from the sequence of complex waveform data and outputting it for each resampling signal, and wherein said frame sample counting means defines the end of the frame by counting N resampling signals after receiving the trigger signal.

16. The digital lock-in amplifier of claim 15, further comprising waveform averaging means connected to the output of said resampling means, for averaging the complex waveform data of a predetermined number of frames.

17. A digital lock-in amplifier coupled to receive an analog input signal, a clock of a fixed period, and a reference signal, comprising:

A/D converting means for receiving the analog input signal and converting it, in synchronism with the clock of a fixed period, into a digital signal expressed by a sequence of digital waveform data;

real memory means which has at least L storage areas for storing the sequence of digital waveform data from said A/D converting means, L being a positive integer;

local signal generating means for generating a digital sine wave local signal and a digital cosine wave local signal;

frequency converting means for receiving the digital signal read out of said real memory means, for shifting the digital signal to the difference frequency region by mixing it with each of the sine wave local signal and the cosine wave local signal, and for outputting the frequency-converted digital signals as complex waveform data;

trigger signal generating means for receiving the reference signal and generating a trigger signal when a predetermined requirement of the reference signal is met;

frame defining means, responsive to the trigger signal, for defining a frame composed of a sequence of L successive digital waveform data in a fixed positional relation to the trigger signal; and phase synchronizing means, responsive to the trigger signal, for synchronizing the sine wave local signal and the cosine wave local signal with the trigger signal.

18. The digital lock-in amplifier of claim 17, wherein said local signal generating means includes:

first and second memories having stored therein digital sample values of the sine wave local signal wave local signal, respectively; and address generating means for accumulating a predetermined value for each clock, for repeating the accumulation until the accumulated value exceeds a predetermined value and, for each accumulation, providing the accumulated value as an address to each of said first and second memories, wherein said phase synchronizing means resets the address generated by said address generating means to a fixed initial value.

19. The digital lock-in amplifier of claim 17, wherein said frame defining means includes remaining sample counting means for defining the end of the frame by the Mth digital waveform data after receiving the trigger signal, M being an integer equal to or greater than L.

20. The digital lock-in amplifier of claim 19, further comprising:

resampling signal generating means for extracting the clock at regular intervals and outputting it as a resampling signal;

resampling means for extracting complex waveform data from the sequence of complex waveform data from said frequency converting means and outputting it for each resampling signal; and control means for controlling the read and write of said real memory means, wherein said remaining sample counting means generates a frame end signal immediately after the Mth digital waveform data and said control means responds to the frame end signal to switch said real memory means to a read mode.

21. The digital lock-in amplifier of claim 20, further comprising real memory address generating means for counting the clock and repeatedly generating a sequence of L addresses for application to said real memory means.

22. The digital lock-in amplifier of claim 20 or 21, further including waveform averaging means connected to the output of said resampling means, for averaging the complex waveform data of a predetermined number of frames to produce averaged complex waveform data as an output.

23. A digital lock-in amplifier, coupled to receive an analog input signal, comprising:

an A/D converter, coupled to receive the analog input signal, for converting the analog input signal into a digital signal;

a sine wave generator for generating a sine wave local signal;

a cosine wave generator for generating a cosine wave local signal;

a first digital frequency converter, coupled to said sine wave generator and said A/D converter for mixing the digital signal with the sine wave local signal and for outputting a first frequency-converted digital signal;

a second digital frequency converter, coupled to said cosine wave generator and said A/D converter, for mixing the digital signal with the cosine wave local signal and for outputting a second frequency-converted digital signal, the first and second frequency-converted digital signals forming complex waveform data;

a trigger circuit for generating a trigger signal;

a frame sample counter, coupled to said trigger circuit, for defining a frame composed of a sequence of N successive complex waveform data, wherein N is a positive integer;

a phase latch, coupled to said trigger circuit and to said sine and cosine wave generators, for latching and holding sample values of the sine wave local signal and the cosine wave local signal in a fixed positional relation to the trigger signal; and means for rotating the phase angle of the complex waveform data of the frame defined by said frame sample counter to a fixed phase angle on the basis of the phase information latched in said phase latch.

* * * * *

UNITED STATES PATENT AND TRADEMARK OFFICE
CERTIFICATE OF CORRECTION

PATENT NO. : 4,914,677
DATED : APRIL 3, 1990
INVENTOR(S) : TAKAHIRO YAMAGUCHI ET AL.

It is certified that error appears in the above-identified patent and that said Letters Patent is hereby corrected as shown below:

Col. 1, line 32, "Acos($2\pi f \cdot t + \cdot$)" should be --Acos($2\pi f \cdot t + \Omega$)--.

Col. 8, line 21, "output" should be --input--.

Signed and Sealed this

Seventeenth Day of September, 1991

Attest:

HARRY F. MANBECK, JR.

*Attesting Officer*     *Commissioner of Patents and Trademarks*